(12) United States Patent
Salahuddin et al.

(10) Patent No.: US 11,276,606 B2
(45) Date of Patent: Mar. 15, 2022

(54) INTEGRATED ELECTRONIC CIRCUIT WITH AIRGAPS

(71) Applicant: IMEC VZW, Leuven (BE)

(72) Inventors: Shairfe Muhammad Salahuddin, Leuven (BE); Alessio Spessot, Heverlee (BE)

(73) Assignee: IMEC vzw, Leuven (BE)

( * ) Notice: Subject to any disclaimer, the term of this patent is extended or adjusted under 35 U.S.C. 154(b) by 126 days.

(21) Appl. No.: 16/577,332

(22) Filed: Sep. 20, 2019

(65) Prior Publication Data
US 2020/0152503 A1    May 14, 2020

(30) Foreign Application Priority Data
Nov. 13, 2018 (EP) .................................... 18205965

(51) Int. Cl.
*H01L 21/764* (2006.01)
*H01L 21/02* (2006.01)
*H01L 21/311* (2006.01)
*H01L 29/51* (2006.01)

(52) U.S. Cl.
CPC ........ *H01L 21/764* (2013.01); *H01L 21/0228* (2013.01); *H01L 21/02112* (2013.01); *H01L 21/31105* (2013.01); *H01L 29/515* (2013.01)

(58) Field of Classification Search
CPC ............. H01L 21/764; H01L 21/02112; H01L 21/0228; H01L 21/31105; H01L 29/515; H01L 23/485; H01L 21/76834; H01L 23/5222; H01L 23/53295; H01L 29/4991; H01L 21/7682
See application file for complete search history.

(56) References Cited

U.S. PATENT DOCUMENTS

| | | | |
|---|---|---|---|
| 6,627,168 B1 * | 9/2003 | Ohtsubo | H01L 21/0217 438/780 |
| 7,928,003 B2 | 4/2011 | Naik | |
| 9,000,594 B2 | 4/2015 | Ott et al. | |

(Continued)

FOREIGN PATENT DOCUMENTS

| | | |
|---|---|---|
| CN | 104637898 A | 5/2015 |
| CN | 102956611 B | 3/2017 |
| EP | 3082161 A1 | 10/2016 |

OTHER PUBLICATIONS

Lo, et al., "BEOL Compatible 2D Layered Materials as Ultra-Thin Diffusion Barriers for Cu Interconnect Technology", 2017 75th Annual Device Research Conference (DRC), Jun. 25-28, 2017, DOI: 10.1109/DRC.2017.7999485 © 2017 IEEE.

(Continued)

*Primary Examiner* — David Vu
(74) *Attorney, Agent, or Firm* — Knobbe, Martens, Olson & Bear, LLP

(57) ABSTRACT

A method for forming airgaps within an integrated electronic circuit implements a conformal layer and a nanosheet both of boron nitride. The method has advantages for the circuit due to special properties of boron nitride material. In particular, mechanical strength and heat dissipation are increased whereas electro-migration is limited. The method may be applied to the first interconnect layer of the integrated circuit, for reducing additionally capacitive interactions existing between gate electrode structures and source or drain contact structures.

13 Claims, 1 Drawing Sheet

(56) References Cited

U.S. PATENT DOCUMENTS

| | | |
|---|---|---|
| 9,123,727 B2 | 9/2015 | Fischer |
| 9,793,193 B1 | 10/2017 | Bonilla et al. |
| 2004/0102031 A1 | 5/2004 | Kloster et al. |
| 2009/0093100 A1* | 4/2009 | Xia .................... H01L 23/5283 |
| 2009/0093132 A1* | 4/2009 | Xu ..................... H01L 21/0217 |
| | | 438/780 |
| 2014/0061926 A1 | 3/2014 | Han et al. |
| 2017/0287811 A1* | 10/2017 | Pei ....................... H01L 23/291 |
| 2017/0317212 A1* | 11/2017 | Kim ..................... H01L 29/785 |
| 2018/0166383 A1 | 6/2018 | Cao et al. |
| 2020/0105577 A1* | 4/2020 | Liang ................. H01L 23/5283 |

OTHER PUBLICATIONS

Lo, et al., "Studies of two-dimensional h-BN and MoS2 for potential diffusion barrier application in copper interconnect technology", npj 2D Materials and Applications (2017) 1:42 ; doi:10.1038/s41699-017-0044-0.

Extended European Search Report dated May 19, 2020 for European Patent Application No. 18205965.9 in 5 pages.

\* cited by examiner

INTEGRATED ELECTRONIC CIRCUIT WITH AIRGAPS

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 18205965.9, filed on Nov. 13, 2018. The aforementioned application is incorporated by reference herein in its entirety, and is hereby expressly made a part of this specification.

FIELD

A method for forming airgaps within an integrated electronic circuit implements a conformal layer and a nanosheet both of boron nitride.

BACKGROUND

Interconnect layers within an integrated electronic circuit each comprise electrically conducting portions such as tracks, vias and/or contact structures which are at a same level above the surface of a substrate of the circuit, and separated from each other by electrically insulating portions. One particular interconnect layer is that which is located just above the substrate surface, and which contains the gate electrode structures of the circuit field-effect transistors, and also contains their source and drain contact structures. This particular interconnect layer is commonly called first interconnect layer and its material is called interlayer dielectric material.

Well-known issues for the interconnect layers are electro-migration of the material forming the conducting portions, mechanical strength, heat dissipation and capacitive interactions existing between neighboring conducting portions. Electro-migration causes alterations in the shape of the conducting portions and may even produce unwanted short circuits, thereby damaging the circuit permanently. In addition, temperature increase, in particular due to insufficient heat dissipation capability during operation of the circuit, activates electro-migration. Capacitive interactions may cause additional power consumption and may reduce the operation performance of the circuit.

Document U.S. Pat. No. 9,793,193 B1 discloses forming airgaps within the first interconnect layer, between gate electrode structures and source or drain contact structures. The airgaps are intermediate between a lower conformal layer, in particular a conformal silicoboron carbonitride layer, and a further layer which can pinch off openings of cavities so as to form the airgaps. The further layer may also be of silicoboron carbonitride. Such airgaps are efficient for reducing capacitive interactions between neighboring gate electrode structures and source or drain contact structures because of their dielectric constant value, known as K-value in the art, equal to unity which is less than that of any dielectric solid material. But airgaps prevent heat from flowing efficiently from the substrate, in particular from the transistors, toward the interconnect layers. Also airgaps reduce the mechanical strength of the circuit.

Document U.S. Pat. No. 9,000,594 B2 discloses implementing two stacked interconnect levels which comprise copper-containing structures that are spaced apart by airgaps within each interconnect level. Sidewalls and a topmost surface of each copper-containing structure is coated with a contiguous layer of graphene, and a continuous dielectric capping layer is located above the lower interconnect level. In this way, the dielectric capping layer forms a ceiling which closes upwardly the airgaps of the lower interconnect level, and forms a floor for the copper-containing structures of the upper interconnect level. But such structure for an interconnect level requires removing portions of the graphene contiguous layer between the copper-containing structures within each interconnect level, because these portions will otherwise short between the copper-containing structures due to the electrical conductivity of graphene material.

Document US 2017/0287811 A1 discloses implementing a heat dissipation layer over an active area of an integrated electronic circuit where at least one field-effect transistor is located. The heat dissipation layer is comprised of a single-layer or multi-layer boron nitride film, or a boron nitride nanosheet. It is formed on the circuit by a transfer process. Boron nitride provides high heat-conduction while being electrically insulating.

Starting from this situation, one object of the embodiments consists in providing an efficient combination between reducing electro-migration in interconnect layers, increasing heat dissipation, and implementing airgaps while maintaining sufficient mechanical strength for the circuit.

Another object of the embodiments consists in implementing such combination in a manner that is compatible with the circuit manufacturing process and tools as used before the embodiments were developed.

SUMMARY

For meeting at least one of these objects or others, a first aspect proposes a method for forming at least one airgap within an integrated electronic circuit, which method comprises the following steps: 1) providing an integrated circuit part intended for forming part of the circuit, the circuit part exhibiting at least two exposed surface portions which coincide with one and same level plane of the circuit and are apart from each other, and the circuit part further exhibiting an open cavity located between the surface portions; 2) depositing a conformal layer of boron nitride on the circuit part, so that this conformal layer covers a bottom and sidewalls of the cavity without filling this cavity up to the level plane; 3) applying a boron nitride nanosheet on the circuit part so that this nanosheet is supported by the surface portions and bridges between these surface portions above the cavity, thereby forming the airgap between the conformal layer and the nanosheet; and 4) optionally after step 3, forming a further part of the circuit on the nanosheet, on a side thereof which is opposed to the cavities, so as to complete the circuit.

Thanks to the mechanical properties of boron nitride material, the nanosheet participates to the mechanical strength of the circuit. Indeed, mechanical strength of boron nitride is more than $10^4$ times higher than that of silica.

Thanks to the high heat-conductivity of boron nitride material, the conformal layer and the nanosheet participate to heat dissipation during an operation of the circuit. Indeed, the thermal conductivity of boron nitride is about 180 times higher than that of silica. In this way, a temperature increase of the circuit is limited so that electro-migration is reduced.

Additionally, capacitive interactions which may occur between conducting parts of the circuit are reduced thanks to the airgaps produced by the method of the embodiments.

Furthermore, implementing airgaps and boron nitride according to the embodiments does not necessitate additional photolithography step in the circuit manufacturing process.

Each surface portion concerned with the method of the embodiments may be formed by an electrically conducting element of the circuit, including a metal track portion or a via, a gate electrode of a transistor, a source or drain contact of a transistor, etc. Alternatively, each surface portion may be separated from an electrically conducting element of the circuit by a portion of the conformal layer on this conducting element.

In particular, when one of the surface portions is formed by a gate electrode structure of a field-effect transistor, and another one of the surface portions is formed by a source contact structure or drain contact structure of the field-effect transistor, the airgap may be located between the gate electrode structure and the source contact structure or drain contact structure, respectively, of the field-effect transistor. In such case, the surface portions and the airgap may belong to the first interconnect layer, and the at least one airgap replaces at least part of the interlayer dielectric material of this first interconnect layer. Then, before step 1, the circuit part may comprise a dielectric solid portion between the gate electrode structure and the source contact structure or drain contact structure, and the cavity may be formed by etching at least part of this dielectric solid portion.

In step 2, the conformal layer of boron nitride may be deposited using an atomic layer deposition (ALD) process or a chemical vapor deposition (CVD) process. Available existing tools for ALD or CVD may then be used, and the thickness layer can be controlled accurately in this way.

In certain implementations, the nanosheet may extend continuously so as to bridge above several cavities in the circuit part, each cavity being located between at least two neighboring surface portions, all of these surface portions coinciding with the same level plane of the circuit, and all the cavities being located on one and same side of the nanosheet toward a substrate of the circuit. In this way, one same nanosheet may be used for producing several airgaps in the circuit, with a single execution of step /3/. Thus the circuit manufacturing time is not increased significantly.

Again in certain implementations of the embodiments, possibly including the former ones with several airgaps per circuit part, the circuit part may be one among a plurality of circuit parts all juxtaposed within a wafer being processed for manufacturing simultaneously a plurality of integrated electronic circuits. Then, the nanosheet may be applied in step 3 across the whole wafer so that it extends continuously on all the circuit parts of the wafer, and bridges above at least one cavity within each circuit part. In this way, one same nanosheet may be used for producing several circuits in parallel from one wafer, with a single execution of step 3. Thus the wafer processing time is not increased significantly.

A second aspect proposes an integrated electronic circuit with at least one airgap, which circuit comprises: at least two interface portions which coincide with one and same level plane within the circuit and are apart from each other; a nanosheet of boron nitride which extends between both interface portions; a cavity which is located next to the nanosheet between the interface portions, on a side of the nanosheet toward a substrate of the circuit; and a conformal layer of boron nitride, which covers a bottom of the cavity opposite the nanosheet, and also covers sidewalls of the cavity without filling this cavity, so that the airgap is formed by the cavity between the conformal layer and the nanosheet.

Such circuit may be produced using a method according to the first aspect.

Generally, one or several of the following additional features may be reproduced in the circuit of the embodiments: at least one of the interface portions may be formed by an electrically conducting element of the circuit, or may be separated from an electrically conducting element of the circuit by a portion of the conformal layer on this conducting element; the nanosheet may extend continuously between and next to several cavities in the circuit, each cavity being located between at least two neighboring interface portions, all of these interface portions coinciding with the same level plane of the circuit, and all the cavities being located on the same side of the nanosheet toward the substrate of the circuit; one of the interface portions may be formed by a gate electrode structure of a field-effect transistor, and another one of the interface portions may be formed by a source contact structure or drain contact structure of the field-effect transistor, so that the airgap is located between the gate electrode structure and the source contact structure or drain contact structure of the field-effect transistor; and the conformal layer of boron nitride may have diamond-like crystal structure.

In a generally applicable third aspect (i.e. independently combinable with any of the aspects or embodiments identified herein), a method is provided for forming at least one airgap within an integrated electronic circuit, comprising: providing an integrated circuit part adapted for forming part of the integrated electronic circuit, the integrated circuit part comprising at least two surface portions are exposed and which coincide with a one and a same level plane of the integrated electronic circuit, wherein the at least two surface portions are apart from each other, and wherein the integrated circuit part further comprises an open cavity located between two of the at least two surface portions; depositing a conformal layer of boron nitride on the integrated circuit part, so that the conformal layer covers a bottom and sidewalls of the open cavity without filling the open cavity up to the one and the same level plane; and applying a boron nitride nanosheet on the integrated circuit part so that the boron nitride nanosheet is supported by the surface portions and bridges between the exposed surface portions above the open cavity, thereby forming the at least one airgap between the conformal layer and the boron nitride nanosheet.

In an embodiment of the third aspect, which is generally applicable (i.e., independently combinable with any of the aspects or embodiments identified herein), at least one of the at least two surface portions is formed by an electrically conducting element of the circuit, or is separated from an electrically conducting element of the circuit by a portion of the conformal layer on the electrically conducting element of the circuit.

In an embodiment of the third aspect, which is generally applicable (i.e., independently combinable with any of the aspects or embodiments identified herein), the conformal layer of boron nitride is deposited using an atomic layer deposition process or a chemical vapor deposition process.

In an embodiment of the third aspect, which is generally applicable (i.e., independently combinable with any of the aspects or embodiments identified herein), the boron nitride nanosheet extends continuously so as to bridge above several cavities in the integrated circuit part, wherein each of the several cavities is located between at least two neighboring surface portions, wherein all of the at least two neighboring surface portions coinciding with the one and the same level plane of the integrated electronic circuit, and wherein all of the several cavities are located on a one and a same side of the boron nitride nanosheet toward a substrate of the integrated electronic circuit.

In an embodiment of the third aspect, which is generally applicable (i.e., independently combinable with any of the aspects or embodiments identified herein), the method further comprises, after applying a boron nitride nanosheet: forming a further part of the integrated electronic circuit on the boron nitride nanosheet, on a side of the boron nitride nanosheet which is opposed to the several cavities, so as to complete a circuit.

In an embodiment of the third aspect, which is generally applicable (i.e., independently combinable with any of the aspects or embodiments identified herein), the integrated circuit part is one among a plurality of circuit parts all juxtaposed within a wafer being processed for manufacturing simultaneously a plurality of integrated electronic circuits, and wherein the boron nitride nanosheet is applied across a whole of the wafer so that the boron nitride nanosheet extends continuously on all of the plurality of circuit parts, and wherein the boron nitride nanosheet bridges above at least one cavity within each of the plurality of circuit parts.

In an embodiment of the third aspect, which is generally applicable (i.e., independently combinable with any of the aspects or embodiments identified herein), one of the at least two surface portions is formed by a gate electrode structure of a field-effect transistor, and wherein another one of the at least two surface portions is formed by a source contact structure or drain contact structure of the field-effect transistor, so that the airgap is located between the gate electrode structure and the source contact structure or drain contact structure, respectively, of the field-effect transistor.

In an embodiment of the third aspect, which is generally applicable (i.e., independently combinable with any of the aspects or embodiments identified herein), providing an integrated circuit part comprises forming the cavity by etching at least part of a dielectric solid portion between the gate electrode structure and the source contact structure or drain contact structure.

In a generally applicable fourth aspect (i.e. independently combinable with any of the aspects or embodiments identified herein), an integrated electronic circuit with at least one airgap is provided, comprising: at least two interface portions which coincide with a one and a same level plane within the integrated electronic circuit and which are apart from each other; a nanosheet of boron nitride which extends between each of the at least two interface portions; a cavity located next to the nanosheet between each of the at least two interface portions, on a side of the nanosheet toward a substrate of the integrated electronic circuit; and a conformal layer of boron nitride, which covers a bottom of the cavity opposite the nanosheet, and also covers sidewalls of the cavity without filling the cavity, so that the airgap is formed by the cavity between the conformal layer and the nanosheet.

In an embodiment of the fourth aspect, which is generally applicable (i.e., independently combinable with any of the aspects or embodiments identified herein), at least one of the at least two interface portions is formed by an electrically conducting element of the integrated electronic circuit, or is separated from an electrically conducting element of the integrated electronic circuit by a portion of the conformal layer on the electrically conducting element.

In an embodiment of the fourth aspect, which is generally applicable (i.e., independently combinable with any of the aspects or embodiments identified herein), the nanosheet extends continuously between and next to several cavities in the circuit, wherein each cavity of the several cavities is located between at least two neighboring interface portions, wherein all of the interface portions coincide with the one and the same level plane of the integrated electronic circuit, and wherein each cavity of the several cavities is located on a same side of the nanosheet toward the substrate of the circuit.

In an embodiment of the fourth aspect, which is generally applicable (i.e., independently combinable with any of the aspects or embodiments identified herein), one of the at least two interface portions is formed by a gate electrode structure of a field-effect transistor, and another one of the at least two interface portions is formed by a source contact structure or drain contact structure of the field-effect transistor, so that the airgap is located between the gate electrode structure and the source contact structure or drain contact structure of the field-effect transistor.

In an embodiment of the fourth aspect, which is generally applicable (i.e., independently combinable with any of the aspects or embodiments identified herein), the conformal layer of boron nitride has a diamond-like crystal structure.

BRIEF DESCRIPTION OF THE DRAWINGS

For clarity sake, element sizes which appear in these figures do not correspond to actual dimensions or dimension ratios. Also, same reference signs which are indicated in different ones of these figures denote identical elements of elements with identical function.

DETAILED DESCRIPTION

Figure 1:
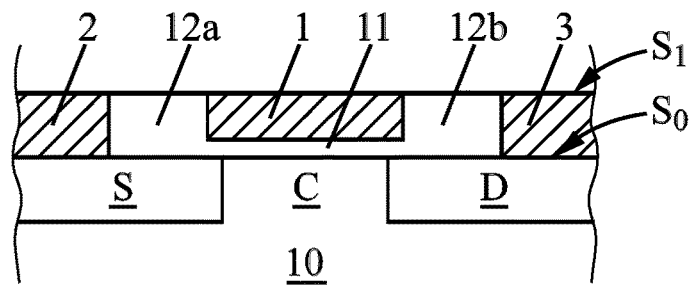
FIGS. 1 to 5 are cross-sectional views of an integrated electronic circuit being manufactured, using a method according to the embodiments.

With reference to FIG. 1, an integrated electronic circuit being manufactured comprises a substrate 10 with at least one transistor formed at a surface $S_0$ thereof. In a known manner, the transistor, when of field-effect type, comprises a source zone S and a drain zone D within the substrate 10 below the surface $S_0$, separated by a channel zone C. A gate electrode structure has been already produced on the substrate surface $S_0$ above the channel zone C, which comprises a gate dielectric film 11 and a gate electrode 1. A source contact structure 2 and a drain contact structure 3 have been produced also on the substrate surface $S_0$, above the source zone S and the drain zone D respectively. The gate electrode 1, the source contact structure 2 and the drain contact structure 3 are further surrounded by dielectric portions 12a and 12b, which may comprise a gate spacer around the gate electrode 1 and additional dielectric portions in circuit areas apart from the transistor. For example, reference sign 12a denotes a portion of the gate spacer which is intermediate between the gate electrode 1 and the source contact structure 2, and reference sign 12b denotes a portion of the same gate spacer which is intermediate between the gate electrode 1 and the drain contact structure 3. The circuit has been then processed by a chemical-mechanical polishing step, or CMP, for forming the upper surface $S_1$ of the circuit parallel to the substrate surface $S_0$. The upper surface $S_1$ has been called level plane in the general part of the description, and the upper surfaces of the gate electrode structure, and those of the source contact structure 2 and drain contact structure 3 within this level plane $S_1$ have been called surface portions. They are exposed until they become covered as described further below, and form interface portions after they have been covered.

Although only one transistor has been represented in the figures, the circuit comprises a large number of such transistors distributed at the surface $S_0$ of the substrate 10, all processed in parallel during common processing steps. In addition, in a well-known manner, the substrate 10 belongs to a wafer at this stage of the circuit manufacturing process, the wafer being intended to be cut at the end of the process for producing separated circuits. Thus, the wafer forms the respective substrates 10 of a large number of integrated circuits all being manufactured in parallel during common processing steps. Although it is no longer indicated below, the circuit manufacturing steps described thereafter apply simultaneously to the whole useful area of the wafer.

Figure 2:
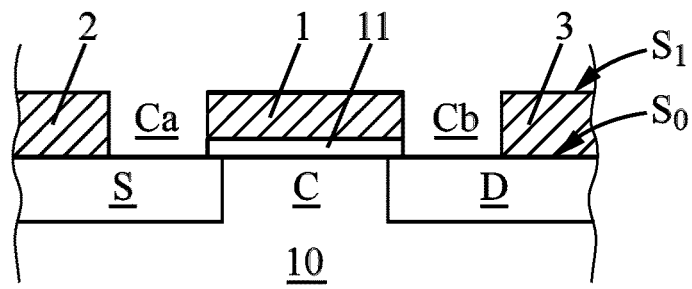

The circuit being manufactured is then processed by an etching step for removing at least part of the dielectric portions 12a and 12b. Any etching process known in the art but appropriate to the material(s) of these portions 12a and 12b may be implemented to this end, for example of wet etching type. Thus, a cavity Ca is produced at the location of the dielectric portion 12a, and a cavity Cb at the location of the dielectric portion 12b, as represented in FIG. 2. Although not shown in the FIGS. 2-5, the etching process may be stopped before the surface $S_0$ becomes uncovered at the bottom of the cavities Ca and Cb, leading to thin dielectric films possibly remaining between the substrate surface $S_0$ and the bottom surfaces of the cavities Ca and Cb.

Figure 3:
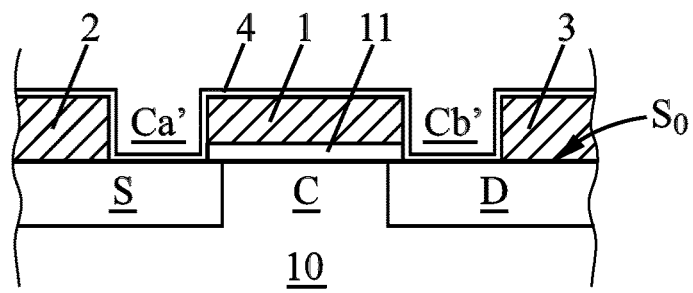

Then according to the embodiments, a conformal layer 4 of boron nitride (BN) is deposited on the circuit being manufactured, as represented in FIG. 3. A conformal layer is a continuous layer with a substantially uniform and well-defined thickness, the layer following the topography of the underlying structure. After the deposition of the conformal layer 4, the conformal layer 4 in the cavities Ca and Cb is only present with a uniform thickness on the surface and the sidewalls of these cavities, leaving a further opening in each cavity. The conformal layer 4 does not completely fill the cavities, thereby only reducing their depth. The cavities Ca and Cb thus altered are denoted Ca' and Cb' in FIGS. 3-5. A BN atomic layer deposition process may be implemented for providing good control of the thickness of the BN material being deposited, and also control of the quality of the material deposited. Deposition parameters may be implemented for obtaining BN material with diamond-like crystal structure. The thickness of the conformal BN layer 4 may be about 2 nm (nanometer) or less, for example. Possibly, a chemical vapor deposition process or a radiofrequency-assisted magnetron sputtering process may be used alternatively for producing the conformal BN layer 4. All these deposition processes are well-known in the art, so that it is not necessary to describe them again here. One can refer for descriptions of such processes to any relevant publication widely available.

Figure 4:
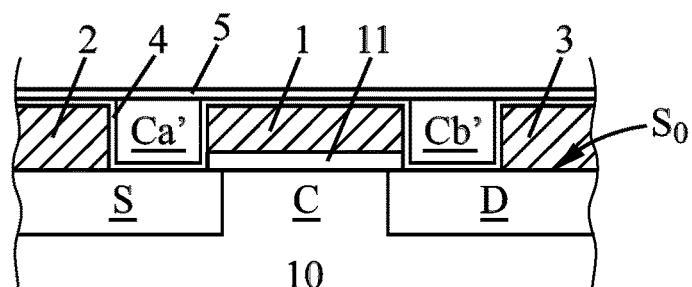

In a next step of a method according to the embodiments, a nanosheet 5 of boron nitride is applied on the circuit being manufactured, as represented in FIG. 4. In a well-known manner, a nanosheet is a two-dimensional structure with thickness in a scale ranging from 1 to 100 nm (nanometer). The nanosheet 5 is applied so that it remains substantially flat, and contacts the conformal layer 4 above the gate electrode 1, the source contact structure 2 and the drain contact structure 3. Thus, the nanosheet 5 bridges between the gate electrode 1 and the source contact structure 2 on the one hand, and also between the gate electrode 1 and the drain contact structure 3 on the other hand. So the nanosheet 5 closes the cavities Ca' and Cb' on a side thereof which is opposite the substrate 10. The cavities Ca' and Cb' thus become airgaps within the first interconnect level. Any transfer process may be implemented for applying the nanosheet 5 on the circuit, including those processes which use a temporary support for the nanosheet 5. One can refer again to any relevant publication widely available about such transfer processes.

Optionally, an annealing step may then be applied to the circuit, in particular for increasing adhesion between the conformal BN layer 4 and the BN nanosheet 5 at the locations where they contact each other, i.e. outside the airgaps. Alternatively, the BN conformal layer 4 may have been removed from the upper surfaces of the gate electrode 1 and the source and drain contact structures 2, 3 before the BN nanosheet 5 is applied. In such case, the BN nanosheet 5 is applied directly on the exposed upper surfaces of the gate electrode 1 and the source and drain contact structures 2, 3.

Figure 5:
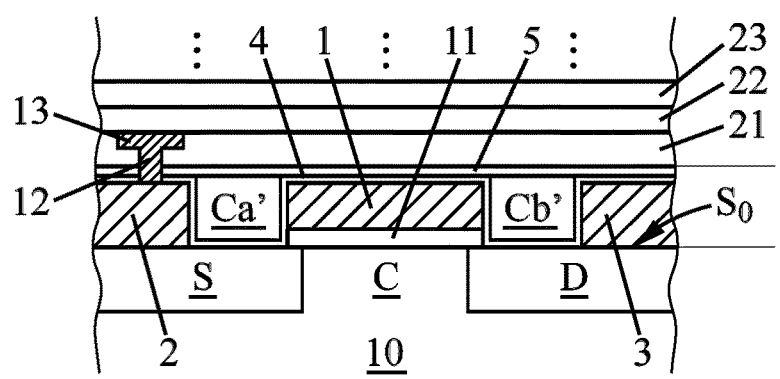

The gate electrode structure, the source and drain contact structures 2, 3, the conformal BN layer 4, the airgaps Ca', Cb' and the BN nanosheet 5 form the first interconnect level 20 of the circuit (see FIG. 5).

Because boron nitride material is electrically insulating, the conformal layer 4 and the nanosheet 5 do not create unwanted electrical path between the gate electrode 1 and the source or drain contact structure 2, 3. The electrical design of the circuit can thus remain unchanged with respect to one developed initially for a manufacturing process as existing before the development of the embodiments.

Because boron nitride material has very high mechanical strength, airgaps are created across the wafer according to the embodiments with uniform thickness and controlled in-plane dimensions, while allowing arranging additional interconnect levels above the BN nanosheet 5. The airgaps reduce interconnect capacitance values that exist between electrically conducting elements of the circuit, in particular between the gate electrode 1 and the source and drain contact structures 2 and 3.

Because boron nitride material has good barrier properties, the conformal layer 4 is efficient for preventing electromigration to occur or to be sufficient for causing dysfunction of the circuit, for the materials of the gate electrode 1 and source and drain contact structures 2 and 3.

And finally, because boron nitride has high heat-conductivity, it is efficient in participating to dissipate heat that is generated in the circuit when in operation. In this way, temperature increase is limited, which further participates to limiting electro-migration.

FIG. 5 shows the circuit after its manufacturing has been continued. Reference numbers 21, 22, 23 . . . denote further interconnect levels which have been stacked on the BN nanosheet 5. Details of conducting parts within these interconnect levels 21, 22, 23 . . . are not shown, except a via 12 and a track 13 within the interconnect level 21. These are for showing compatibility of the method of the embodiments with the known processes used for connecting electrically the gate electrode 1 and the source and drain contact structures 2, 3. No additional photo-lithography step is necessary, since the conformal BN layer 4 and the BN nanosheet 5 can be etched at the same time as the dielectric material of the interconnect level 21.

It should be understood that the embodiments may be implemented while changing or adapting secondary aspects thereof, with respect to the detailed description provided before. In particular, it may be implemented in interconnect levels other that the first one which contains the gate electrode structures above the substrate surface.

Also, the embodiments may be combined advantageously with transistor configurations other than those located at the substrate surface as mentioned with reference to the figures. In particular, it can be combined with three-dimensional integration such as monolithic three-dimension integrated circuit, three-dimension stacked circuits, etc.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

As used in the claims below and throughout this disclosure, by the phrase "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method of forming at least one airgap within an integrated electronic circuit, comprising:
   providing an integrated circuit part adapted to form part of the integrated electronic circuit, the integrated circuit part comprising at least two surface portions formed such that respective upper surfaces of the at least two surface portions are exposed and formed on a same level plane of the integrated electronic circuit, wherein the at least two surface portions are apart from each other, and wherein the integrated circuit part further comprises an open cavity located between two adjacent surface portions of the at least two surface portions;
   depositing a conformal layer of boron nitride on the integrated circuit part, so that the conformal layer covers a bottom and sidewalls of the open cavity; and
   without filling the open cavity to the same level plane of the respective upper surfaces of the at least two surface portions, applying a boron nitride nanosheet on the integrated circuit part over the open cavity so that the boron nitride nanosheet is supported by respective upper surfaces of the at least two surface portions and extends between adjacent surface portions of the at least two surface portions to cover the open cavity, thereby forming the at least one airgap between the conformal layer and the boron nitride nanosheet.

2. The method of claim 1, wherein at least one surface portion of the at least two surface portions is formed by an electrically conducting element of the integrated circuit part, or is separated from an electrically conducting element of the integrated circuit part by a portion of the conformal layer on the electrically conducting element of the integrated circuit part.

3. The method of claim 1, wherein the conformal layer is deposited using an atomic layer deposition process or a chemical vapor deposition process.

4. The method of claim 1, wherein the boron nitride nanosheet extends between adjacent surface portions of the at least two surface portions to cover respective open cavities formed between respective adjacent surface portions of the at least two surface portions, wherein all of the at least two surface portions coincide with each other at the same level plane of the integrated electronic circuit, and wherein all of the covered cavities are located on a same side of the boron nitride nanosheet toward a substrate of the integrated electronic circuit.

5. The method of claim 4, further comprising, after applying the boron nitride nanosheet:
   forming a further part of the integrated electronic circuit on the boron nitride nanosheet, on a side of the boron nitride nanosheet which is opposed to the covered cavities, so as to complete a circuit.

6. The method of claim 1, wherein the integrated circuit part is a circuit part among a plurality of circuit parts all juxtaposed within a wafer being processed for manufacturing simultaneously the plurality of integrated electronic circuits, and wherein the boron nitride nanosheet is applied across a whole of the wafer so that the boron nitride nanosheet extends continuously on all of the plurality of circuit parts, and wherein the boron nitride nanosheet extends above at least one cavity within each of the plurality of circuit parts.

7. The method of claim 1, wherein a surface portion of the at least two surface portions is formed by a gate electrode structure of a field-effect transistor, and wherein another surface portion of the at least two surface portions is formed by a source contact structure or drain contact structure of the field-effect transistor, so that a respective airgap is located between the gate electrode structure and the source contact structure or drain contact structure, respectively, of the field-effect transistor.

8. The method of claim 7, wherein providing the integrated circuit part comprises forming the cavity by etching at least part of a dielectric solid portion between the gate electrode structure and the source contact structure or drain contact structure.

9. An integrated electronic circuit with at least one airgap, comprising:
   at least two interface portions formed such that a respective surface of the at least two interface portions is formed on a same level plane within the integrated electronic circuit, and the at least two interface portions are spaced apart from each other;
   a nanosheet of boron nitride which extends between adjacent interface portions of the at least two interface portions;
   a cavity located next to the nanosheet between adjacent interface portions of the at least two interface portions, on a side of the nanosheet toward a substrate of the integrated electronic circuit; and
   a conformal layer of boron nitride, the conformal layer covers a bottom of the cavity opposite the nanosheet, and also covers sidewalls of the cavity without filling the cavity, so that the airgap is formed by the cavity between the conformal layer and the nanosheet when the nanosheet is formed over the at least two interface portions.

10. The integrated electronic circuit of claim 9, wherein at least one interface portion of the at least two interface portions is formed by an electrically conducting element of the integrated electronic circuit, or is separated from an electrically conducting element of the integrated electronic circuit by a portion of the conformal layer on the electrically conducting element.

11. The integrated electronic circuit of claim 9, wherein the nanosheet extends continuously between adjacent surface portions and next to at least two cavities in the integrated electronic circuit, wherein each cavity of the at least two cavities is located between at least two neighboring interface portions, wherein all of the interface portions coincide with each other at the same level plane of the integrated electronic circuit, and wherein each cavity of the at least two cavities is located on a same side of the nanosheet toward the substrate of the integrated electronic circuit.

12. The integrated electronic circuit of claim 9, wherein at least one interface portion of the at least two interface portions is formed by a gate electrode structure of a field-effect transistor, and another one of the at least two interface portions is formed by a source contact structure or drain contact structure of the field-effect transistor, so that a respective airgap is located between the gate electrode structure and the source contact structure or drain contact structure of the field-effect transistor.

13. The integrated electronic circuit of claim 9, wherein the conformal layer has a diamond-like crystal structure.

* * * * *